United States Patent
Byman et al.

(10) Patent No.: US 12,166,350 B2
(45) Date of Patent: Dec. 10, 2024

(54) HANDLING OF LOST TIME SYNCHRONIZATION IN A SUBSTATION NETWORK

(71) Applicant: Hitachi Energy Ltd, Zürich (CH)

(72) Inventors: Carl Byman, Vasteras (SE); Johan Salj, Eskilstuna (SE); Henrik Pind, Vasteras (SE)

(73) Assignee: HITACHI ENERGY LTD, Zürich (CH)

( * ) Notice: Subject to any disclaimer, the term of this patent is extended or adjusted under 35 U.S.C. 154(b) by 587 days.

(21) Appl. No.: 17/441,487

(22) PCT Filed: Apr. 14, 2020

(86) PCT No.: PCT/EP2020/060373
§ 371 (c)(1),
(2) Date: Sep. 21, 2021

(87) PCT Pub. No.: WO2020/212300
PCT Pub. Date: Oct. 22, 2020

(65) Prior Publication Data
US 2022/0181878 A1  Jun. 9, 2022

(30) Foreign Application Priority Data
Apr. 16, 2019 (EP) .................... 19169478

(51) Int. Cl.
*H02J 3/08* (2006.01)
*G01R 3/00* (2006.01)
(Continued)

(52) U.S. Cl.
CPC .............. *H02J 3/08* (2013.01); *G01R 31/002* (2013.01); *H02J 3/004* (2020.01); *H02J 3/144* (2020.01); *H02H 7/26* (2013.01)

(58) Field of Classification Search
CPC ... H02J 3/08; H02J 3/004; H02J 3/144; G01R 31/002; H02H 7/26
See application file for complete search history.

(56) References Cited

U.S. PATENT DOCUMENTS

| 4,225,960 A | 9/1980 | Masters |
| 7,630,863 B2 * | 12/2009 | Zweigle ................. H02H 7/261 |
| | | 702/187 |

(Continued)

FOREIGN PATENT DOCUMENTS

| CH | 1651596 | * 12/2016 |
| CN | 102801557 A | 11/2012 |

(Continued)

OTHER PUBLICATIONS

International Search Report and Written Opinion of the International Searching Authority for related PCT application No. PCT/EP2020/060373 dated Apr. 14, 2020, 15 pages.

(Continued)

*Primary Examiner* — Lina Cordero
*Assistant Examiner* — Lynda Dinh
(74) *Attorney, Agent, or Firm* — PROCOPIO, CORY HARGREAVES & SAVITCH LLP (57) ABSTRACT

There is provided mechanisms for handling time shifted data streams in a substation network. A method is performed by an IED. The method comprises receiving a respective data stream from at least two time synchronized data sources in the substation network. The method comprises blocking, (Continued)

upon detecting a time shift between the data streams resulting from one of the data sources losing its time synchronization and until a configured time amount has expired, a protection function in the substation network from acting based on the data streams.

15 Claims, 4 Drawing Sheets (51) Int. Cl.
*G01R 31/00* (2006.01)
*H02H 7/26* (2006.01)
*H02J 3/00* (2006.01)
*H02J 3/14* (2006.01)

(56) References Cited

U.S. PATENT DOCUMENTS

| | | |
|---|---|---|
| 2009/0088989 A1 | 4/2009 | Guzman-Casillas |
| 2011/0035065 A1 | 2/2011 | Schweitzer, III et al. |
| 2011/0035076 A1 | 2/2011 | Schweitzer, III et al. |
| 2011/0063766 A1 | 3/2011 | Kasztenny et al. |
| 2014/0111249 A1 | 4/2014 | Whitehead et al. |
| 2017/0059636 A1* | 3/2017 | Kerger ............ H02H 7/263 |
| 2018/0034746 A1* | 2/2018 | Kanabar ............ H04L 41/069 |
| 2018/0109369 A1* | 4/2018 | Hamour ............ H04L 7/0016 |

FOREIGN PATENT DOCUMENTS

| | | | |
|---|---|---|---|
| EP | 3136528 | A1 | 3/2017 |
| JP | H10-42448 | A | 2/1998 |
| JP | 2010-246084 | A | 10/2010 |
| JP | 2015-023742 | A | 2/2015 |
| JP | WO2015/063815 | * | 5/2015 |
| JP | 2018-091828 | A | 6/2018 |
| JP | 2018-117227 | A | 7/2018 |
| SE | 1651596 | A1 | 12/2016 |
| WO | 2014/002191 | A1 | 1/2014 |
| WO | 2015/063815 | A1 | 5/2015 |

OTHER PUBLICATIONS

Watt et al., Understanding and Applying Precision Time Protocol, 2015 Saudi Arabia Smart Grid (SASG), IEEE, Dec. 7, 2015, XP032889968, DOI: 10.1109/SASG. 2015.7449285, Schweitzer Engineering Laboratories, Inc., USA, 7 pages.

Extended European Search Report for related EP Application No., 19169478.5 dated Oct. 30, 2019, 9 pages.

* cited by examiner

HANDLING OF LOST TIME SYNCHRONIZATION IN A SUBSTATION NETWORK

CROSS-REFERENCE TO RELATED APPLICATIONS

The present application is a national stage entry of International Patent App. No. PCT/EP2020/060373, filed on Apr. 14, 2020, which claims priority to European Patent App. No. 19169478.5, filed on Apr. 16, 2019, which are both hereby incorporated herein by reference as if set forth in full.

BACKGROUND

Field of the Invention

Embodiments presented herein relate to a method, an intelligent electronic device (IED), a computer program, and a computer program product for handling time shifted data streams caused by lost time synchronization in a substation network.

Related Art

In general terms, substations are part of an electrical generation, transmission, and distribution system. Substations act as connection points between different transmission lines of the electrical system and might additionally transform voltage from high to low, or the reverse, or perform any of several other functions. Between the generating station and consumer, electric power may flow through several substations at different voltage levels. A substation may include transformers to change voltage levels between high transmission voltages and lower distribution voltages, or at the interconnection of two different transmission voltages.

In general terms, substations are often unattended, relying on remote supervision and control. In this respect, data streams from different data sources within a substation may be fed to a protection function configured to, based on the data streams, make a trip decision and thus to determine whether or not to trip a circuit breaker.

In general terms, for protections functions whose trip decision depends on data streams from several data sources, the data streams need to be time correlated. A precise and unified time synchronization of the data sources is thus required for the protection function to work properly. In systems where the time synchronization is propagated in a hierarchical manner (e.g. a system with multiple subnetworks interconnected with boundary clocks and using the precision time protocol, PTP, or its profile subset International Electrotechnical Commission, IEC, 61850-9-3) a time shift in the time source (or a switch of time source) may imply a substantial propagation delay of the time shift throughout the system within the substation. In turn, this might lead to transient time differences between the data sources that can lead to miss-operations of the protection function. If the data streams received by the protection function cannot be guaranteed to be time correlated the protection function should therefore be blocked such that false trips are avoided.

However, there is still a need for an improving the performance of the protection function in substation networks.

SUMMARY

An object of embodiments herein is to provide efficient mechanisms for handling time shifted data streams in a substation network that can be used to improve the performance of the protection function.

According to a first aspect there is presented a method for handling time shifted data streams in a substation network. The method is performed by an IED. The method comprises receiving a respective data stream from at least two time synchronized data sources in the substation network. The method comprises blocking, upon detecting a time shift between the data streams resulting from one of the data sources losing its time synchronization and until a configured time amount has expired, a protection function in the substation network from acting based on the data streams.

According to a second aspect there is presented an IED for handling time shifted data streams in a substation network. The IED comprises processing circuitry. The processing circuitry is configured to cause the IED to receive a respective data stream from at least two time synchronized data sources in the substation network. The processing circuitry is configured to cause the IED to block, upon detecting a time shift between the data streams resulting from one of the data sources losing its time synchronization and until a configured time amount has expired, a protection function in the substation network from acting based on the data streams.

According to a third aspect there is presented a computer program for handling time shifted data streams in a substation network, the computer program comprising computer program code which, when run on an IED, causes the IED to perform a method according to the first aspect.

According to a fourth aspect there is presented a computer program product comprising a computer program according to the third aspect and a computer readable storage medium on which the computer program is stored. The computer readable storage medium could be a non-transitory computer readable storage medium.

Advantageously this provides efficient blocking of the protection function when the data sources are without time synchronization.

Advantageously this provides efficient blocking of the protection function as long as necessary.

Advantageously this enables better utilization of the protection function, but still avoids any false trips.

Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, module, action, etc." are to be interpreted openly as referring to at least one instance of the element, apparatus, component, means, module, action, etc., unless explicitly stated otherwise. The actions of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any action or feature illustrated by dashed lines should be regarded as optional.

Figure 1:
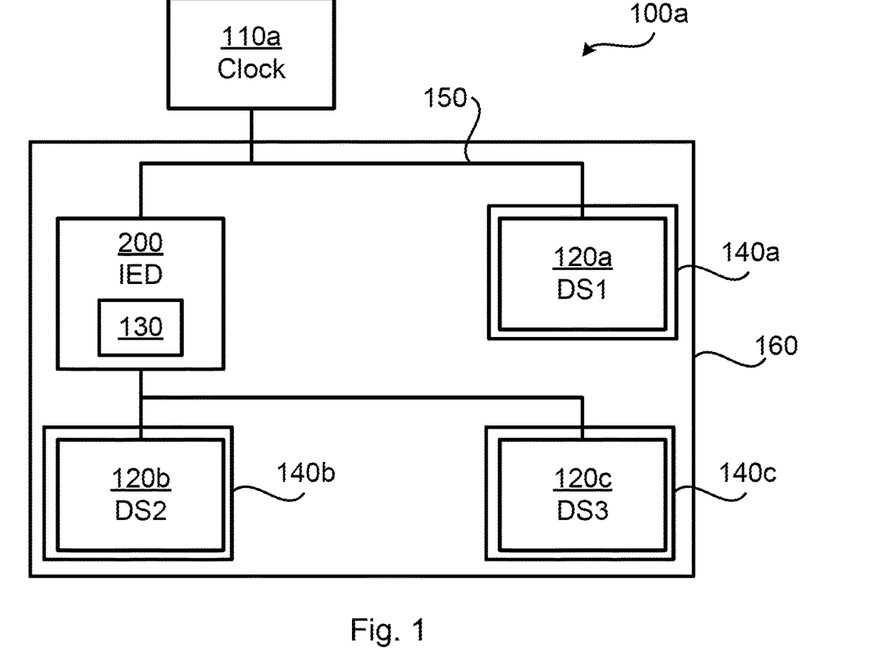
FIGS. 1 and 2 are schematic diagrams illustrating substation networks according to embodiments.

FIG. 1 is a schematic diagram illustrating a substation network 100a where embodiments presented herein can be applied. The substation network 100a comprises data sources 120a, 120b, 120c (denoted $DS_1$, $DS_2$, $DS_3$). The data sources 120a, 120b, 120c are configured to generate data streams and provide the data streams to a protection function 130. Each data source 120a, 120b, 120c might belong to a respective merging unit 140a, 140b, 140c (denoted $MU_1$, $MU_2$, $MU_3$ in FIGS. 4 and 5) of a substation 160 in the substation network 100a.

The protection function 130 is part of, integrated with, or collocated with, an IED 200. There could be different examples of protection functions. In some examples the protection function 130 is a relay protection function or a control function, such as a synchronization check function. The data sources 120a, 120b, 120c belong to the MUs 140a, 140b, 140c that provide data streams in the form of analog samples to the protection function 130 via a process bus 150. Each data stream might thus comprise analog samples, for example representing voltage or current measurements of MUs 140a, 140b, 140c in the substation network 100a, 100b.

The data sources 120a, 120b, 120c are time synchronized by means of a time source 110a, which might act as a grand master clock for the substation network 100a.

Figure 2:
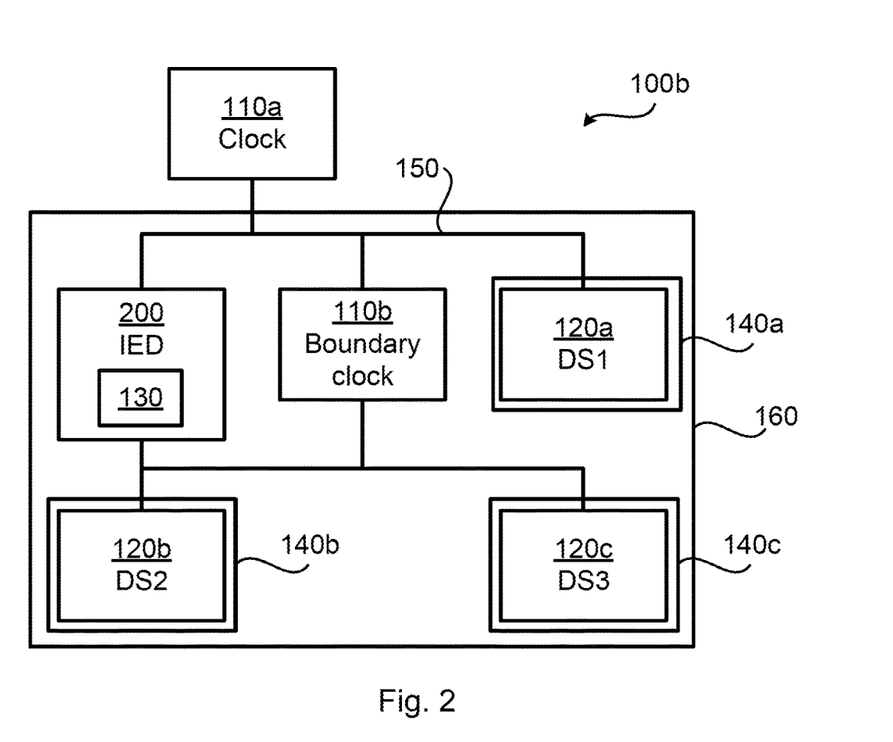

FIG. 2 is a schematic diagram illustrating a substation network 100b where embodiments presented herein can be applied. The substation network 100b comprises the same components as the substation network 100a. In addition thereto, a further time source 110b is provided in the form of a boundary clock. In FIG. 2 the boundary clock is physically separated from the IED 200; the substation network 100a might also comprises a boundary clock that might be integrated with, or collocated with, the IED 200.

As disclosed above, data streams from data sources 120a, 120b, 120c of the MUs 140a, 140b, 140c may be fed to the protection function 130 for making a trip decision. As further disclosed above, there is a need for improving the performance of the protection function 130.

In more detail, when there is a time shift (such as a change of reference time) in the substation network 100a, 100b, all data sources 120a, 120b, 120c might not change time at the same time. This can e.g. be the case when a new time source 110a, 110b is connected to a substation network 100a, 100b that was previously without time synchronization or when different substation networks, each having its own time source, are connected together.

When the data sources of the substation is time synchronized via PTP (or IEC 61850-9-3), the new time will ripple from the clock through the substation network 100a, 100b to each data source 120a, 120b, 120c. This means that during a transition, e.g. when a clock regains time synchronization after freely drifting for some time, there will be different times in different parts of the substation network 100a, 100b.

As a non-limiting illustrative example, assume with reference to FIG. 1 or FIG. 2, that the time source 110a experiences a failure causing it to lose time synchronization for some time and then regains reliable time synchronization from, for example, a satellite system (not shown). The correct time will thus reach $MU_1$ and the IED 200 (including the protection function 130) first. Then, the correct time will propagate to $MU_2$ and $MU_3$ through the boundary clock 110b (either provided inside the IED 200 as in FIG. 1 or as a separate entity as in FIG. 2). This means that for a short duration, $MU_2$ and $MU_3$ will both appear to be time synchronized, but they will in practice have different time compared to $MU_1$ and the IED 200 (including the protection function 130). Therefore, if the protection function 130 is not blocked during this situation, a false trip might be triggered by the protection function 130. The blocking of the protection function 130 can be stopped when all devices (IED and MUs) are time synchronized from the same time source.

As this illustrative example shows, when the time shift occurs the data streams from the different data sources 120a, 120b, 120c might thus be out of time synchronization with respect to each other, which in turn might lead to that e.g. a differential current is registered at the protection function 130 which causes a trip to be triggered, even if there is no fault in any of the MUs 140a, 140b, 140c, or parts thereof. As noted above, this issue can be mitigated by blocking the protection function 130 during these situations. However, it might be cumbersome to determine when to start blocking of the protection function 130 and for how long the duration of the blocking should last. Otherwise there is a potential risk that the time duration for which the protection function 130 is blocked is either too short (leading to potential false trips), or too long (leading to potentially missing registering a true differential current at the protection function 130, which causes a true trip to be missed).

One way is to block the protection function 130 when the protection function 130 itself detects a time shift in the data streams. However, this does not help if one or more of the data sources 120a, 120b, 120c shifts time before this time shift in the data streams is detected by the protection function 130.

Another way is to include information to what master time source each data source 120a, 120b, 120c is connected. However, this only works if all data sources 120a, 120b, 120c (and the protection function 130) support such functionality. This will also block the protections function 130 even if not necessary when the time is the same for all data sources 120a, 120b, 120c but where the data sources 120a, 120b, 120c are using different time sources, e.g. when a main time source is lost for some of the and other time sources take over.

Further, if a system loses the clock and another time source in the system takes the roles as grand master clock, the changeover will not take place at the same time for all data sources 120a, 120b, 120c. This will lead to block of the protections function 130 even without a time shift.

According to the herein disclosed embodiments there is provided mechanisms that prevent the miss operations (e.g. by blocking the protection function 130) during the propagation of the time shift. Also, mechanisms are provided to limit the blocking of the protection function 130 as much as possible, but still prevent false trips (i.e., trips without any reason in the substation network 100a, 100b).

This is achieved by blocking the protection function 130 when needed but limit the time as much as possible as well as avoid blocking the protection function 130 when not needed.

The embodiments disclosed herein in particular relate to mechanisms for handling time shifted data streams in a substation network 100a, 100b. In order to obtain such mechanisms there is provided an IED 200, a method performed by the IED 200, a computer program product comprising code, for example in the form of a computer program, that when run on an IED 200, causes the IED 200 to perform the method.

Figure 3:
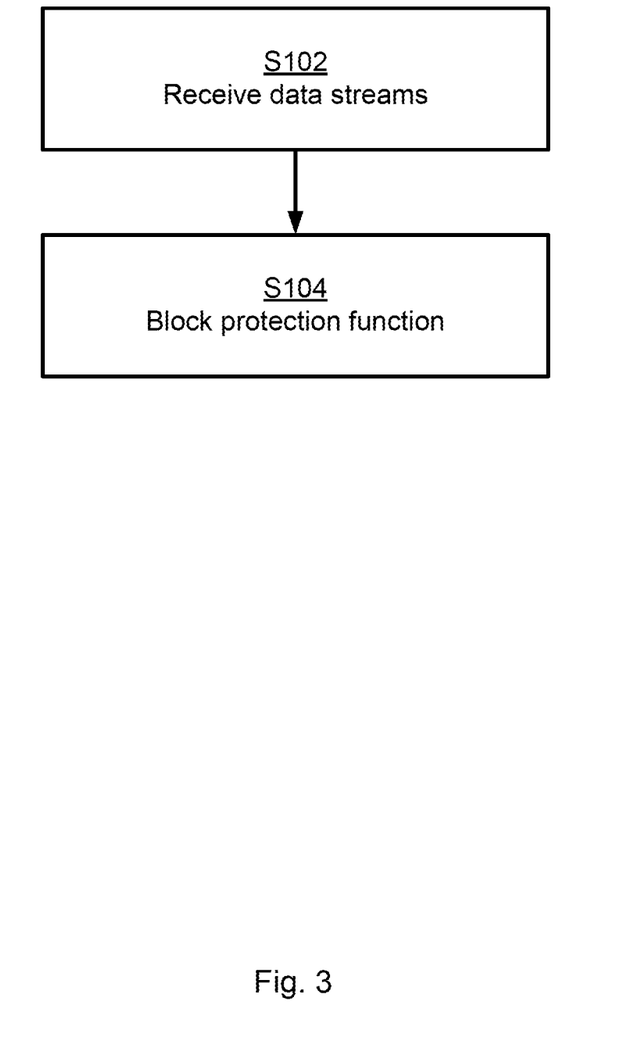
FIG. 3 is a flowchart of a method according to an embodiment.

FIG. 3 is a flowchart illustrating embodiments of a method for handling time shifted data streams in a substation network 100a, 100b. The method is performed by the IED 200. The methods are advantageously provided as computer programs 720.

S102: The IED 200 receives a respective data stream from at least two time synchronized data sources 120a, 120b, 120c in the substation network 100a, 100b.

The blocking of the protection function 130 starts when the IED 200 detects that at least one data stream contains time shifted data. The protection function 130 is directly blocked when such a time shift is detected S104: The IED 200 blocks, upon detecting a time shift between the data streams resulting from one of the data sources 120a, 120b, 120c losing its time synchronization and until a configured time amount has expired, the protection function 130 in the substation network 100a, 100b from acting based on the data streams.

Embodiments relating to further details of handling time shifted data streams in a substation network 100a, 100b as performed by the IED 200 will now be disclosed.

The configured time amount is dependent on a clock domain hierarchy of the data sources 120a, 120b, 120c in the substation network 100a, 100b. The configured time amount can have a static value. Alternately, the configured time amount can be set dependent on a clock domain hierarchy of the data sources in the substation network. Here, according to the clock domain hierarchy, the configured time period may be a static or dynamic value. Further examples of this will be disclosed below.

By detecting when any data source 120a, 120b, 120c shifts time, the blocking can cover lost data from any data source 120a, 120b, 120c. In addition, the blocking is set to last so long after the time shift has been detected such that that all other data sources has at least started their time shift and therefore their time shift can be detected by the protection function 130. To optimize the duration of the blocking, the blocking can be removed when all data sources 120a, 120b, 120c are time synchronized from the same time source 110a, 110b.

In general terms, when a data source 120a, 120b, 120c shifts time there is either a jump in time of the samples or the data stream comprises an indication that it is without time synchronization. The time shift might thus be detected either by that the data streams become unsynchronized or there is a jump in sample count in the data streams. That is, in some aspects the time shift is detected by that the data streams become timewise mutually unsynchronized or there is a jump in sample count in the data stream from at least one, but not all, of the data sources 120a, 120b, 120c. With this information the IED 200 is enabled detect that there is a time shift between the data streams.

In some aspects the clock domain hierarchy defines an order according to which the data sources 120a, 120b, 120c are time synchronized by at least one time source 110a, 110b in the substation network 100a, 100b. Further aspects of this will be disclosed next.

In some aspects, according to the clock domain hierarchy, at least two of the data sources 120a, 120b, 120c are time synchronized from respective different time sources 110a, 110b.

Since the time adjustment of all time sources 120a, 120b, 120c might be in sequence, one data source might achieve time synchronization before another time source has started its time resynchronization. Therefore, in some aspects the protection function 130 is blocked as long as it might take to start the time resynchronization of all other data sources.

Figure 4:
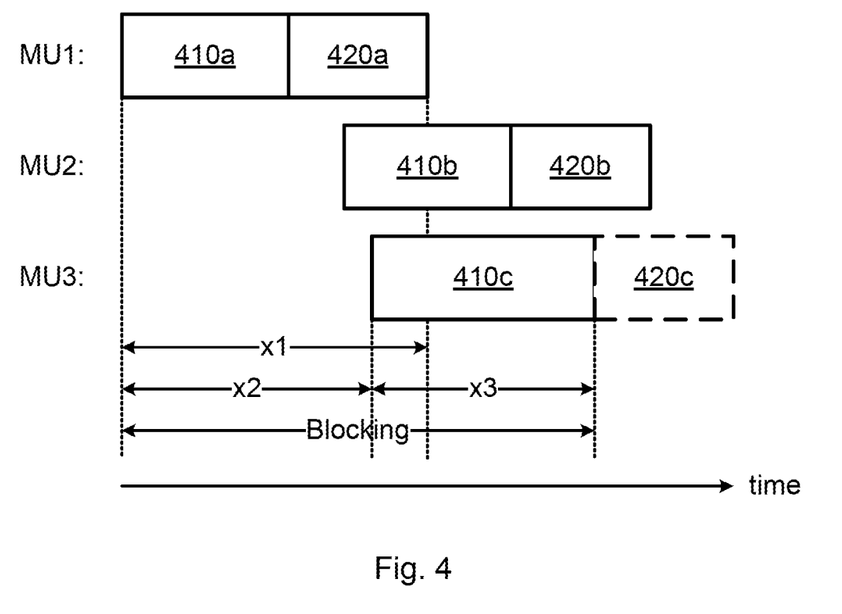
FIGS. 4 and 5 schematically illustrate duration of blocking of a protection function according to according to embodiments.

Reference is now made to FIG. 4 illustrating the duration of the blocking of the protection function 130 according to a first example. Here it is assumed that $MU_1$ is first time synchronized, then $MU_2$, and then finally $MU_3$. It is further assumed that the time it takes to time synchronize $MU_1$ corresponds to 410a, the time it takes to time synchronize $MU_2$ corresponds to 410b, and the time it takes to time synchronize $MU_3$ corresponds to 410c, where 410c is equivalent to ×3 amounts of time units (that could be given in units of seconds or minutes). It is further assumed that an extra block time 420a, 420b is appended for $MU_1$ and $MU_2$ (and optionally an extra block time 420c for $MU_3$). It is further assumed that it takes ×2 amounts of time units (that could be given in units of seconds or minutes) for the time synchronization to start for $MU_3$ after the time synchronization has started at $MU_1$. The total amount of time units that $MU_1$ causes the protection function 130 to be blocked is denoted xi (that could be given in units of seconds or minutes) and is thus equal to the combination of the time it takes to time synchronize $MU_1$ (corresponding to 410a) and the extra block time 420a.

That is, when the data stream starts to deliver time synchronized data again, the protection function 130 is blocked an extra time 420a, 420b. This extra time 420a, 420b is long enough so that the time synchronization has time to propagate from one data source to another. The extra blocking time 420a, 420b might be the same for all data streams and depend on the propagation time for the time synchronization in the substation network 100a, 100b. By means of the extra time, if any other of the data streams starts to shift time during the blocking time, the blocking of the protection function 130 will continue.

In some aspects, according to the clock domain hierarchy, it takes at most ×3 amounts of time units for each data source 120a, 120b, 120c to regain time synchronization, it takes ×2 amounts of time units for the time synchronization to propagate to all data sources 120a, 120b, 120c, and the configured time amount expires ×2 amounts of time units after time synchronization is regained for the data sources 120a, 120b, 120c. This is illustrated in FIG. 4. One example of the maximum value for each data source 120a, 120b, 120c to regain time synchronization is given in IEC 61850-9-3.

In other aspects, according to the clock domain hierarchy, all data sources 120a, 120b, 120c are, from one and the same global time source 110a, time synchronized within ×3 amounts of time units. This is illustrated in FIG. 5.

Figure 5:
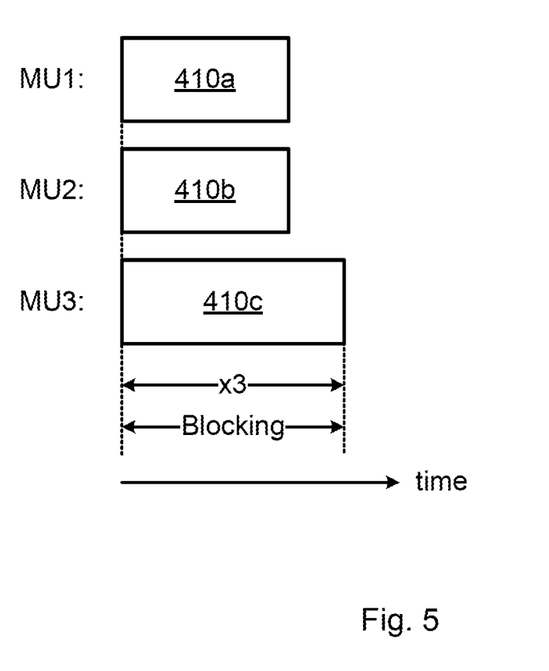

Reference is now made to FIG. 5 illustrating the duration of the blocking of the protection function 130 according to a second example.

Here it is assumed that $MU_1$, $MU_2$, and $MU_3$ are time synchronized in parallel. The extra blocking time 420a, 420b, 420c might therefore be removed. It is further assumed that the time it takes to time synchronize $MU_1$ corresponds to 410a, the time it takes to time synchronize $MU_2$ corresponds to 410b, and the time it takes to time synchronize $MU_3$ corresponds to 410c, being equivalent to ×3 amounts of time units.

In some aspects, according to the clock domain hierarchy, all data sources 120a, 120b, 120c are locally time synchronized within the ×3 amounts of time units and have the same global time source 110a, the time synchronization of all data source 120a, 120b, 120c starts simultaneously, and the configured time amount expires when ×3 amounts of time units have elapsed. This is illustrated in FIG. 5.

The extra blocking time 420a, 420b can thus be shortened, or even removed (as in the example of FIG. 5), if all time sources 110a, 110b are globally time synchronized, or all time sources 110a, 110b are locally time synchronized and have the same grand master clock.

If each data stream comprises information about the time source used by the data source 120a, 120b, 120c from which the data stream originates, the blocking of the protection function 130 might be removed as soon as all data sources 120a, 120b, 120c have the same time source. That is, in some aspects, according to the clock domain hierarchy, when each data stream comprises information identifying the time source 110a, 110b of its data source 120a, 120b, 120c, the configured time amount expires when the information of all data streams identifies one and the same time source 110a, 110b. The time source can be either a common time source or that all time sources 110a, 110b are time synchronized to a global time.

One particular embodiment for handling time shifted data streams in a substation network 100a, 100b based on the above embodiments, examples, and aspects will now be disclosed, using either of the substation networks 100a, 100b as an example implementation.

It is assumed that under normal operation, the time source 110a is used to provide time synchronization of all the data sources 120a, 120b, 120c to global time. It is then assumed that the time source 110a experiences a failure, potentially causing one or more of the data sources 120a, 120b, 120c to lose its time synchronization to the global time.

The IED 200, by means of its time source 110b, then performs time synchronization of all the data sources 120a, 120b, 120c to local time. However, after some time, the time source 110b might drift away from the global time.

The time source 110a is then repaired and starts to send time synchronization messages to the data sources 120a, 120b, 120c (as well as to the IED 200). First, data source 120a (as representing $MU_1$) and the IED 200 (including the protection function 130) start to time synchronize to the new global time. However, data sources 120a, 120b (representing $MU_2$ and $MU_3$) are still on the local time. Thus, while $MU_1$ shifts time and starts to send a data stream towards the protection function 130 with the new time, $MU_2$ and $MU_3$ still send data streams towards the protection function 130 with the old time. Without any blocking of the protection function 130, this situation is likely to cause the protection function 130 to trigger the circuit breaker to trip.

To avoid this erroneous trip to occur, the protection function 130 is blocked an extra time after the IED 200 has detected a time shift in one of the data streams. During this time the new time can propagate to $MU_2$ and $MU_3$, so they can report to the IED 200 that they are out of time synchronization and start to be time synchronized again. The protection function 130 is by the IED 200 blocked during the time shift for $MU_2$ and $MU_3$ (and, optionally, for an extra blocking time). The extra blocking time might be reduced when all MUs report global synchronized data or if all MUs are locally synchronized and identifies one the same time source.

Figure 6:
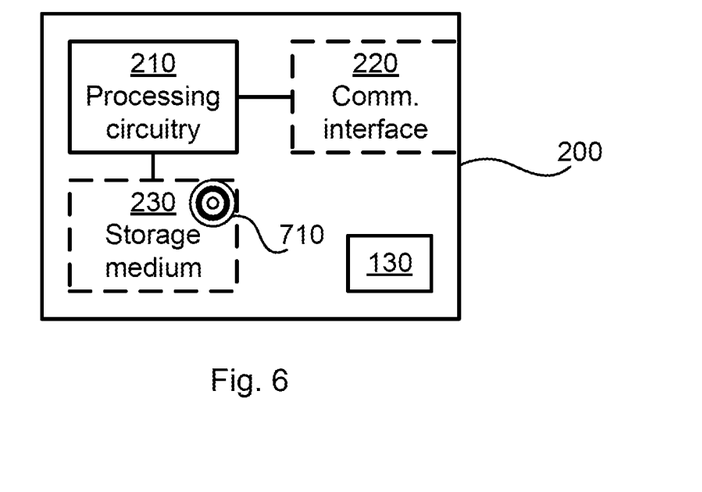
FIG. 6 is a schematic diagram showing functional units of an IED according to an embodiment.

FIG. 6 schematically illustrates, in terms of a number of functional units, the components of an IED 200 according to an embodiment. Processing circuitry 210 is provided using any combination of one or more of a suitable central processing unit (CPU), multiprocessor, microcontroller, digital signal processor (DSP), etc., capable of executing software instructions stored in a computer program product 310 (as in FIG. 7), e.g. in the form of a storage medium 230. The processing circuitry 210 may further be provided as at least one application specific integrated circuit (ASIC), or field programmable gate array (FPGA).

Particularly, the processing circuitry 210 is configured to cause the IED 200 to perform a set of operations, or actions, as disclosed above. For example, the storage medium 230 may store the set of operations, and the processing circuitry 210 may be configured to retrieve the set of operations from the storage medium 230 to cause the IED 200 to perform the set of operations. The set of operations may be provided as a set of executable instructions.

Thus the processing circuitry 210 is thereby arranged to execute methods as herein disclosed. The storage medium 230 may also comprise persistent storage, which, for example, can be any single one or combination of magnetic memory, optical memory, solid state memory or even remotely mounted memory. The IED 200 may further comprise a communications interface 220 at least configured for communications with other entities, functions, nodes, and devices of the substation network 100a, 100b. As such the communications interface 220 may comprise one or more transmitters and receivers, comprising analogue and digital components. The processing circuitry 210 controls the general operation of the IED 200 e.g. by sending data and control signals to the communications interface 220 and the storage medium 230, by receiving data and reports from the communications interface 220, and by retrieving data and instructions from the storage medium 230.

As disclosed above, a protection function 130 is part of, integrated with, or collocated with, the IED 200. Hence, in some aspects the IED further comprises the protection function 130.

Other components, as well as the related functionality, of the IED 200 are omitted in order not to obscure the concepts presented herein.

Figure 7:
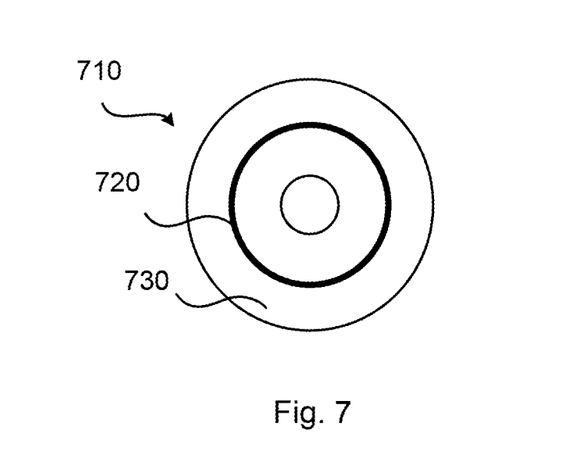
FIG. 7 shows one example of a computer program product comprising computer readable storage medium according to an embodiment.

FIG. 7 shows one example of a computer program product 710 comprising computer readable storage medium 730. On this computer readable storage medium 730, a computer program 720 can be stored, which computer program 720 can cause the processing circuitry 210 and thereto operatively coupled entities and devices, such as the communications interface 220 and the storage medium 230, to execute methods according to embodiments described herein. The computer program 720 and/or computer program product 710 may thus provide means for performing any action as herein disclosed.

In the example of FIG. 7, the computer program product 710 is illustrated as an optical disc, such as a CD (compact disc) or a DVD (digital versatile disc) or a Blu-Ray disc. The computer program product 710 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 720 is here schematically shown as a track on the depicted optical disk, the computer program 720 can be stored in any way which is suitable for the computer program product 710.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A method for handling time shifted data streams in a substation network, the method being performed by an intelligent electronic device (IED) the method comprising:
   receiving a respective data stream from at least two time synchronized data sources in the substation network;
   detecting a time shift between the data streams resulting from one of the data sources losing its time synchronization; and
   upon detecting the time shift and until a configured time amount has expired, blocking a protection function in the substation network from tripping a circuit breaker based on the data streams,
   wherein the configured time amount is dependent on a clock domain hierarchy of the data sources in the substation network,
   wherein according to the clock domain hierarchy at least two of the data sources are time synchronized from respective different time sources,
   wherein according to the clock domain hierarchy, each data source takes at most ×3 amounts of time units to regain time synchronization, and the time synchronization takes ×2 amounts of time units to propagate to all of the data sources, and
   wherein the configured time amount expires ×2 amounts of time units after time synchronization is regained for the data sources.

2. The method according to claim 1, wherein the configured time amount has one of a static value and a dynamic value.

3. The method according to claim 1, wherein the clock domain hierarchy defines an order according to which the data sources are time synchronized by at least one time source in the substation network.

4. The method according to claim 1, wherein, according to the clock domain hierarchy, when each data stream comprises information identifying the time source of a respective one of the data sources, the configured time amount expires when the information of all of the data streams identifies a same time source.

5. The method according to claim 1, wherein the time shift is detected by that the data streams become timewise mutually unsynchronized or there is a jump in sample count in the data stream from at least one, but not all, of the data sources.

6. The method according to claim 1, wherein each of the data sources belongs to a respective merging unit of a substation in the substation network.

7. The method according to claim 1, wherein each data stream comprises analog samples.

8. The method according to claim 7, wherein the analog samples represent voltage or current measurements of merging units of a substation in the substation network.

9. The method according to claim 1, wherein the protection function is a relay protection function.

10. An intelligent electronic device (IED) for handling time shifted data streams in a substation network, the IED comprising processing circuitry, the processing circuitry being configured to cause the IED to:
    receive a respective data stream from at least two time synchronized data sources in the substation network;
    detect a time shift between the data streams resulting from one of the data sources losing its time synchronization; and
    upon detecting the time shift and until a configured time amount has expired, block a protection function in the substation network from tripping a circuit breaker based on the data streams,
    wherein the configured time amount is dependent on a clock domain hierarchy of the data sources in the substation network,
    wherein according to the clock domain hierarchy at least two of the data sources are time synchronized from respective different time sources,
    wherein according to the clock domain hierarchy, each data source takes at most ×3 amounts of time units to regain time synchronization, and the time synchronization takes ×2 amounts of time units to propagate to all of the data sources, and
    wherein the configured time amount expires ×2 amounts of time units after time synchronization is regained for the data sources.

11. The IED according to claim 10, wherein the configured time amount is dependent on a clock domain hierarchy of the data sources in the substation network, wherein the clock domain hierarchy defines an order according to which the data sources are time synchronized by at least one time source in the substation network.

12. The IED according to claim 10, wherein the time shift is detected by that the data streams become timewise mutually unsynchronized or there is a jump in sample count in the data stream from at least one, but not all, of the data sources.

13. A non-transitory computer-readable medium having a computer program stored thereon, wherein the computer program comprises computer code which, when run on processing circuitry of an intelligent electronic device (IED) causes the IED to:
    receive a respective data stream from at least two time synchronized data sources in a substation network;
    detect a time shift between the data streams resulting from one of the data sources losing its time synchronization; and
    upon detecting the time shift and until a configured time amount has expired, block a protection function in the substation network from tripping a circuit breaker based on the data streams,
    wherein the configured time amount is dependent on a clock domain hierarchy of the data sources in the substation network,
    wherein according to the clock domain hierarchy at least two of the data sources are time synchronized from respective different time sources,
    wherein according to the clock domain hierarchy, each data source takes at most ×3 amounts of time units to regain time synchronization, and the time synchronization takes ×2 amounts of time units to propagate to all of the data sources, and wherein the configured time amount expires ×2 amounts of time units after time synchronization is regained for the data sources.

14. The non-transitory computer-readable medium according to claim 13, wherein the configured time amount is dependent on a clock domain hierarchy of the data sources in the substation network, wherein the clock domain hierarchy defines an order according to which the data sources are time synchronized by at least one time source in the substation network.

15. The non-transitory computer-readable medium according to claim 13, wherein the time shift is detected by that the data streams become timewise mutually unsynchronized or there is a jump in sample count in the data stream from at least one, but not all, of the data sources.

* * * * *